(12) United States Patent
Korchemny et al.

(10) Patent No.: US 11,544,435 B1
(45) Date of Patent: Jan. 3, 2023

(54) ON-THE-FLY COMPUTATION OF ANALOG MIXED-SIGNAL (AMS) MEASUREMENTS

(71) Applicant: Synopsys, Inc., Mountain View, CA (US)

(72) Inventors: Dmitry Korchemny, Herzliya (IL); Ilya Kudryavtsev, Herzliya (IL); Eduard Cerny, Jupiter, FL (US); Dmitriy Mosheyev, Herzliya (IL)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/353,208

(22) Filed: Jun. 21, 2021

Related U.S. Application Data

(60) Provisional application No. 63/042,415, filed on Jun. 22, 2020.

(51) Int. Cl.
*G06F 30/3308* (2020.01)
*G06F 30/38* (2020.01)
*G06F 30/327* (2020.01)
*G06F 30/367* (2020.01)
*G06F 30/398* (2020.01)

(52) U.S. Cl.
CPC ........ *G06F 30/3308* (2020.01); *G06F 30/327* (2020.01); *G06F 30/38* (2020.01); *G06F 30/367* (2020.01); *G06F 30/398* (2020.01)

(58) Field of Classification Search
CPC .... G06F 30/3308; G06F 30/38; G06F 30/327; G06F 30/367; G06F 30/398

USPC ............................ 716/111, 106, 136; 703/16
See application file for complete search history.

(56) References Cited

U.S. PATENT DOCUMENTS

| | | | |
|---|---|---|---|
| 9,710,591 B1 * | 7/2017 | Derisavi | G06F 30/3312 |
| 9,971,858 B1 * | 5/2018 | Derisavi | G06F 30/327 |
| 11,017,140 B1 * | 5/2021 | Sloss | G06F 9/30134 |
| 11,144,688 B1 * | 10/2021 | Ershov | G06F 30/398 |
| 2010/0328849 A1 * | 12/2010 | Ewing | G06F 11/3089 |
| | | | 361/622 |

\* cited by examiner

*Primary Examiner* — Phallaka Kik
(74) *Attorney, Agent, or Firm* — Patterson + Sheridan, LLP

(57) ABSTRACT

The present disclosure generally relates to an analog mixed-signal (AMS) design verification system. In particular, the present disclosure relates to a system and method for system verification. One example method includes: obtaining an electronic representation of the circuit design; generating at least a portion of a waveform using the electronic representation of the circuit to obtain a first segment of the waveform associated with the circuit; converting, via the one or more processors, one or more measurement functions to code for performing the one or more computations on the first segment of the waveform; performing one or more computations on the first segment of the waveform using the code; and identifying when a behavior of the circuit violates a design specification based on whether a result of the one or more computations meets a threshold.

20 Claims, 8 Drawing Sheets

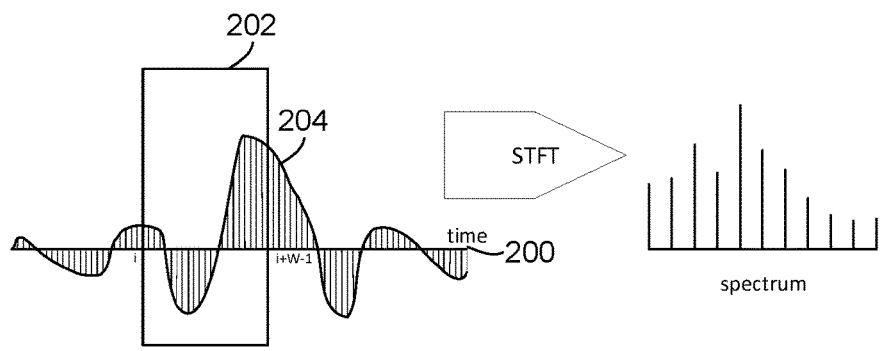
FIG. 2A  FIG. 2B
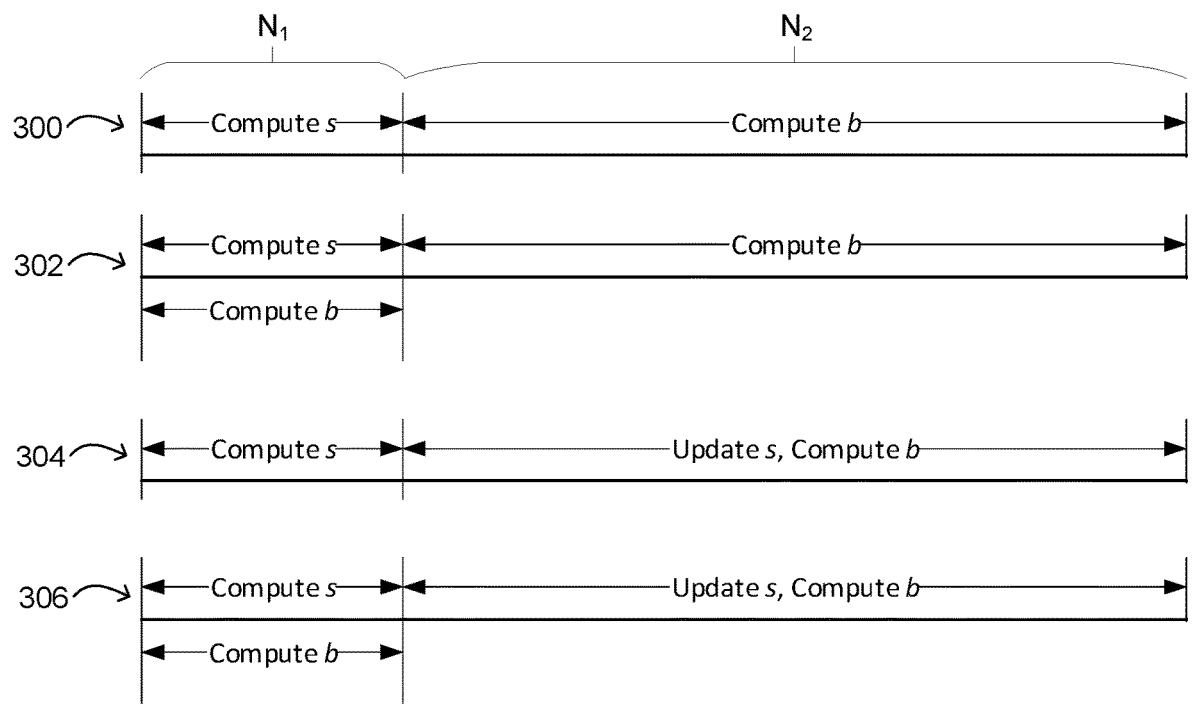
FIG. 3

ON-THE-FLY COMPUTATION OF ANALOG MIXED-SIGNAL (AMS) MEASUREMENTS

CROSS-REFERENCE TO RELATED APPLICATIONS

The present disclosure claims priority to U.S. Provisional Application No. 63/042,415 filed Jun. 22, 2020, which are hereby expressly incorporated by reference herein in their entireties as if fully set forth below and for all applicable purposes.

GOVERNMENT LICENSE RIGHTS

This invention was made with U.S. Government support under Agreement No. HR0011-18-9-0008 awarded by the Defense Advanced Research Projects Agency. The U.S. Government has certain rights in the invention.

TECHNICAL FIELD

The present disclosure generally relates to an analog mixed-signal (AMS) design verification system. In particular, the present disclosure relates to a system and method for providing on-the-fly computation of AMS measurements.

BACKGROUND

In analog mixed-signal (AMS) design verification, a signal waveform is generated using simulation or emulation of a circuit representation, and various values (also referred to as measurements) may be determined. For example, typical measurements include signal amplitude, frequency and phase, average, root mean square (RMS), minimal and maximal values, and duty cycle of the waveform. The values are subsequently checked for correctness against specified bounds to determine whether the behavior of the circuit violates a design specification.

SUMMARY

Some aspects of the present disclosure are directed to a method for system verification. The method generally includes: obtaining an electronic representation of the circuit design; generating at least a portion of a waveform using the electronic representation of the circuit to obtain a first segment of the waveform associated with the circuit; converting, via the one or more processors, one or more measurement functions to code for performing the one or more computations on the first segment of the waveform; and performing one or more computations on the first segment of the waveform using the code. In some aspects, the one or more computations include a bounded computation on samples within an upper bound of the first segment and a lower bound of the first segment, the samples being stored in a buffer. The method also includes identifying when a behavior of the circuit violates a design specification based on whether a result of the one or more computations meets a threshold.

Some aspects of the present disclosure are directed to a method for system verifications. The method generally includes: obtaining an electronic representation of the circuit design; generating at least a portion of a waveform using the electronic representation to obtain a first segment and a second segment of the waveform associated with the circuit; storing samples associated with the first segment of the waveform in a first buffer and samples associated with the second segment of the waveform in a second buffer; performing, via the one or more processors, one or more computations on the second segment of the waveform using the samples stored in the first buffer and the second buffer; and identifying when a behavior of the circuit violates a design specification based on whether a result of the one or more computations meets a threshold.

Some aspects of the present disclosure are directed to an apparatus for system verifications. The method generally includes a memory, and one or more processors coupled the memory. The memory and the one or more processors may be configured to: obtain an electronic representation of the circuit design; generate at least a portion of a waveform using the electronic representation of the circuit to obtain a first segment of the waveform associated with the circuit; convert, via the one or more processors, one or more measurement functions to code for performing the one or more computations on the first segment of the waveform; and perform one or more computations on the first segment of the waveform using the code. In some aspects, the one or more computations include a bounded computation on samples within an upper bound of the first segment and a lower bound of the first segment, the samples being stored in a buffer. The memory and the one or more processors may be further configured to identify when a behavior of the circuit violates a design specification based on whether a result of the one or more computations meets a threshold.

Some aspects of the present disclosure are directed to an apparatus for system verifications. The method generally includes a memory, and one or more processors coupled the memory. The memory and the one or more processors may be configured to: obtain an electronic representation of a circuit; generate at least a portion of a waveform using the electronic representation of the circuit to obtain a first segment and a second segment of the waveform associated with the circuit; store samples associated with the first segment of the waveform in a first buffer and samples associated with the second segment of the waveform in a second buffer; perform the one or more computations on the second segment of the waveform using the samples stored in the first buffer and the second buffer; and identify when a behavior of the circuit violates a design specification based on whether a result of the one or more computations meets a threshold.

Other aspects provide: an apparatus operable, configured, or otherwise adapted to perform the aforementioned methods as well as those described elsewhere herein; a non-transitory, computer-readable media having instructions that, when executed by one or more processors of an apparatus, cause the apparatus to perform the aforementioned methods as well as those described elsewhere herein; a computer program product embodied on a computer-readable storage medium including code for performing the aforementioned methods as well as those described elsewhere herein; and an apparatus having means for performing the aforementioned methods as well as those described elsewhere herein. By way of example, an apparatus may include a processing system, a device with a processing system, or processing systems cooperating over one or more networks.

The following description and the appended figures set forth certain features for purposes of illustration.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

FIGS. 2A and 2B illustrate aspects of a discrete-time short-time Fourier transform (STFT) according to an example of the present disclosure.

FIG. 3 illustrates aspects of precomputing according to an example of the present disclosure.

DETAILED DESCRIPTION

Figure 1:
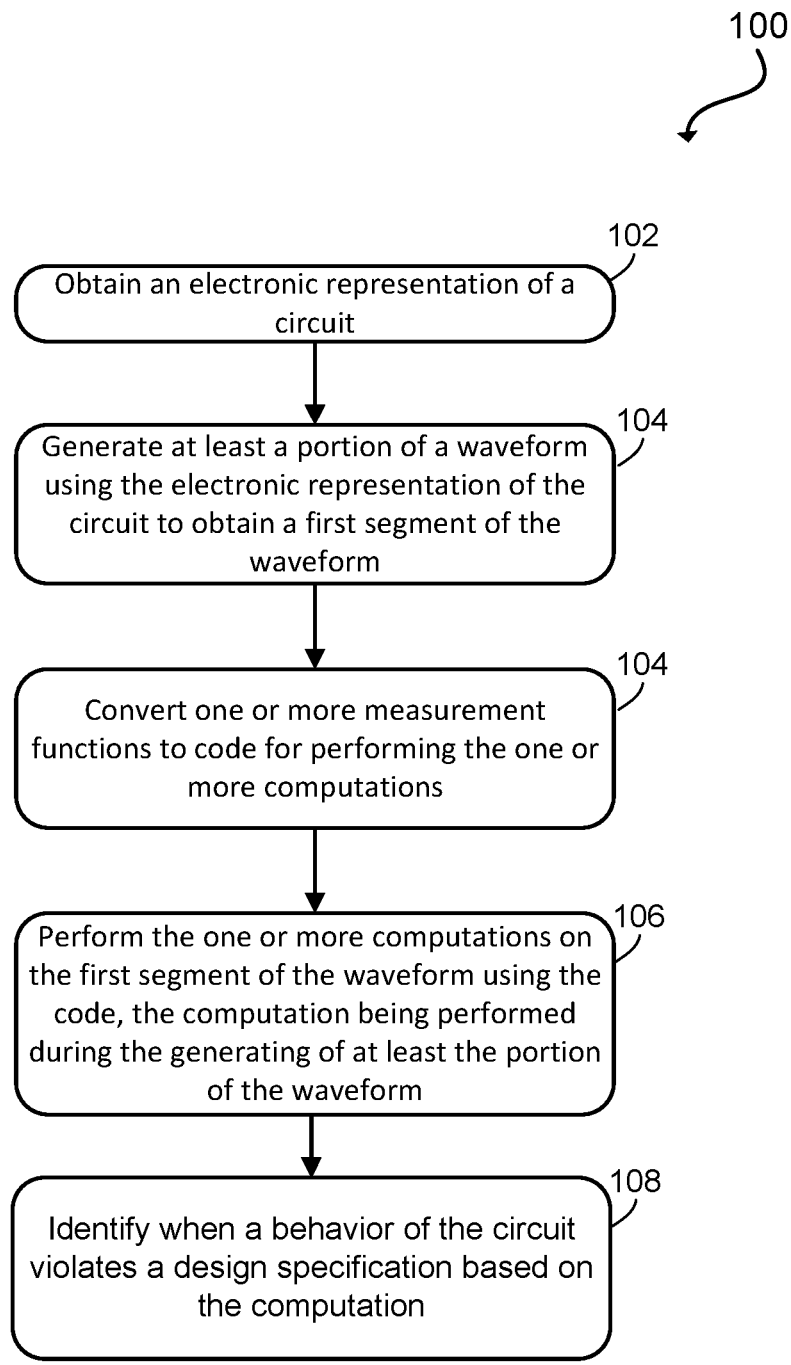
FIG. 1 is a flowchart of a method for on-the-fly analog mixed-signal (AMS) design verification according to an example of the disclosure.

Aspects described herein relate to on-the-fly computation of analog and mixed-signal (AMS) measurements. In some implementations, measurements in AMS design verification are calculated in post-processing mode, from signal traces (waveforms) generated by analog simulators, such as simulation program with integrated circuit emphasis (SPICE). Analog simulations can be time and resource consuming, and many simulations run in parallel to cover different value measurements (e.g., using a Monte-Carlo simulation). Consequently, an entire server farm used for the simulations may be engaged in running the same analog test for a week or more. The simulation results may differ from a desired result (e.g., an expected behavior) for some or all combinations of value measurements, which can cause delay and non-productive usage of computing resources. Some aspects of the present disclosure are directed to techniques for computing signal measurements in parallel with simulation (or emulation) to detect anomalies early, reducing the time-to-market and reducing non-productive usage of computing resources.

A value of a measurement on a segment of a waveform may be computed from signal values in the past (e.g., prior to the segment of the waveform), the present (e.g., the segment of the waveform) and possibly some future instant (e.g., after the segment of the waveform) within some predefined bound. In the latter case, the results of the computation is delayed. From an implementation point of view, the total amount of memory to store simulation trace data to compute the measurements during simulation may be limited. Such a computation is referred to herein as measurement computation on-the-fly.

In addition to measurement, there are other situations where computation on-the-fly can be beneficial. For example, if the generated waveform is too long, it is more efficient to process the waveform piecewise using on-the-fly computation techniques. This is especially important for noise computation in digital simulation environments when real number models (RNM) are used. Another important application of on-the-fly computation is the concurrent collection and checking of measurement results in emulation.

Usually measurement computations and validity checks are done in the post-processing mode using mathematical frameworks such as MATLAB® or NumPy. There, signal traces may be processed as possibly large arrays of data rather than accessing signal samples as soon as they become available in the simulation. This is referred to herein as global evaluation because it has access to the entire trace array. One of the challenges is to reuse the same MATLAB or NumPy specifications in the on-the-fly computation without creating a separate specification for simulation.

An example described herein proposes a system and method for providing automatic conversion of an offline (global) measurement function evaluation to an on-the-fly computation by maintaining a system of buffers of appropriate or bounded sizes. The present system and method may also be used for converting code for checking of measurement results to Boolean or temporal assertions that can be natively verified in simulation.

FIG. 1 is a flow diagram illustrating example operations 100 for circuit design verification, in accordance with certain aspects of the present disclosure. As described in further detail below, the operations 100 may be embodied by one or more sets of instructions, which may be one or more software modules, stored on a non-transitory computer-readable medium. One or more processors of a computer system can be configured to read and execute the one or more sets of instructions, which causes the one or more processors to perform the various operations of the operations 100. In some examples, some operations or steps of the operations 100 may be embodied as one or more sets of instructions as one or more software components, and other operations or steps of the operations 100 may be embodied as one or more other sets of instructions as one or more other software modules. The different software components can be distributed and stored on different non-transitory computer-readable media on different computer systems for execution by respective one or more processors of the different computer systems in some examples.

At 102, the one or more processors obtain an electronic representation of a circuit. The electronic representation may be, for example, a netlist of a design of the circuit, a layout of the design of the circuit, or other representation.

At 104, the one or more processors generate at least a portion of a waveform using the electronic representation of the circuit. At least the portion of the waveform is generated to obtain a first segment of the waveform associated with the circuit. For instance, generating at least the portion of the waveform may include simulating or emulating the electronic representation of the circuit. A signal, such as a current or voltage as a function of time, can be obtained as a waveform by the simulation or emulation at 104. A segment of a waveform can be less than an entirety of the waveform from the simulation or emulation. In some instances, a segment can be a sampled instance of the waveform, some windowed portion of the waveform, or any other segment.

In some aspects, at 106, the one or more processors convert one or more measurement functions (e.g., functions in some mathematical framework such as MATLAB® or NumPy) to code for performing the one or more computations on the first segment of the waveform during the simulation or emulation. For instance, converting the one or more measurement functions to the code for performing the one or more computations include converting the one or more measurement functions to a SystemVerilog Real Number Model (RNM), as described in more detail herein. In some aspects, the one or more computations include a bounded computation on samples within an upper bound of the first segment and a lower bound of the first segment, the samples being stored in a buffer.

At 108, the one or more processors perform computation on the first segment of the waveform using code. For instance, the computation may be performed during the generating of at least the portion of the waveform (e.g., during the simulation or emulation). Various examples of computations are provided herein and described in more detail.

At 110, the one or more processors identify when a behavior of the circuit violates a design specification based on whether a result of the computation meets a threshold. For example, the one or more computations generate a value (e.g., a mean value associated with the first segment of the waveform), and a checker determines whether the value is within some bounded range of a design specification, and if not, an error (e.g., logical 0) may be asserted indicating that the behavior of the circuit violates the design specification. In some aspects, identifying when the behavior of the circuit violates the design specification occurs before the conclusion of the simulation or emulation. In some aspects, the one or more processors terminate the simulation or emulation when the behavior is identified to violate the design specification.

In some examples, the operations at 108 and 110 are performed simultaneously with performing the operations at 104, also referred to below as a simulation mode. The identification of when a behavior of the circuit violates the design specification at 108 while simulation or emulation is occurring at 104 can save time and processing resources by permitting the simulation or emulation to be terminated before the simulation or emulation would otherwise conclude if the behavior is within the design specification (e.g., no error occurs). The violation of the design specification can be identified as soon as possible such that further processing can be avoided. In any of these examples, analyzing segments of waveforms, and the transformations of those segments, can reduce memory usage since, e.g., a portion of any signal is analyzed rather than the entirety of the signal. This can also reduce processing time and usage of processing resources.

Although aspects of examples are described in terms of signals and measurements in AMS models, aspects of these examples may also be applicable to digital models. For example, some aspects provide techniques for AMS measurements using analog and digital signals. A signal waveform can be described as a real function a(t) mapping a real argument t (time) to some physical quantity such as voltage or current. Analog signals are represented with continuous functions, whereas digital signals are represented with piecewise constant functions taking integer values. An important special case of digital signals is Boolean signals which can only assume values 0 and 1 (or false and true).

AMS measurements can be viewed as operators or functional mapping of signals to functions, sequences (e.g., which can also be considered as functions of a natural argument), or numbers. Examples of functions include taking an average of two signals a and b using the expression:

$$\frac{a(t) + b(t)}{2}$$

The domain of the produced function is the time domain, the same as the domain of the original signal functions. Another example function includes a spectrum of signal a computed using a Fourier transform, based on equation:

$$A(\omega) = \int_o^\infty a(t)e^{-j\omega t}dt.$$

In this case, the domain of the resulting function is frequency, not time. Another example function includes sampling of signal a. Given an increasing sequence of time instants $t_1 < t_2, \ldots$, the sampling function produces a sequence of signal values $a(t_1), a(t_2), \ldots$. Another example function includes a mean value of signal a based on expression:

$$\lim_{T \to \infty} \frac{1}{T} \int_0^T a(t)dt.$$

Certain signal and measurement representations are made in post-processing mode. For signal analysis in the post-processing mode, signals can be represented as arrays (vectors) of uniformly sampled values. For example, for a signal a(t) over the time interval [0,T], its representation is an array of values $a(0), a(\Delta t), a(2\Delta t), \ldots, a(\lfloor/\Delta t\rfloor\Delta t)$. Here, $\Delta t$ is the sampling period, and $\lfloor T/\Delta t\rfloor$ designates the function floor. It is possible to consider a more general form of the signal domain interval $[t_0, T+t_0]$, where $t_0$ is an initial time. a[i] is used to designate $a(i\Delta t)$, $i=0, 1, \ldots, N$, where $$N = \left\lfloor \frac{T}{\Delta t} \right\rfloor.$$

It may be assumed that the first array element index is 0. This representation corresponds to a sampling of all signals by some uniform clock, also referred to herein as a global signal representation.

A discrete analog of a measurement is a function mapping arrays to an array or a number. A checker is a measurement producing Boolean values where 1 indicates that the circuit behavior is as expected, and 0 indicates otherwise.

The following examples illustrate discrete measurements and checkers. In these examples i may assume values 0, 1, ..., N, N being a positive integer. One example may include averaging of two signals a and b using the expression:

$$(a[i] + b[i])/2$$

Another example includes performing a signal comparison using the expression:

$$a[i] \geq b[i]$$

The result is a Boolean signal $c[i]=1$ if $a[i] \geq b[i]$ and $c[i]=0$, otherwise.

Another example includes checking for a sinusoidal waveform using expression $|a[i] - A\sin(i\omega\Delta t)| < \delta$, where A is a signal amplitude, $\omega$ is its angular frequency, $\Delta t$ is a period of the sampling clock and $\delta$ is an absolute tolerance.

Another example may include performing a time shift using expression $a[i-m]$, $m \in \mathbb{Z}$. A positive value of m corresponds to a backward shift, and a negative value corresponds to a forward shift. There may be a convention for out-of-range values. The usual convention for out-ofrange indices is that the values are assumed to be 0 or some initial and final values if known.

Another example measurement includes performing a stability check. For instance, signal a after a change may remain stable for at least K>0 additional ticks of the sampling clock. The result of this measurement function is a Boolean array having the value 1 where the stability condition holds.

Another example measurement may include detecting a rising edge of a clock. Given a Boolean signal c representing a clock, its rising edge is computed as (c[i]=0) & (c[i+1]=1). For example, c is defined as $V_{clk} \geq V_{th}$, where $V_{clk}$ is a physical signal representing a clock, and $V_{th}$ is a threshold voltage.

Another example measurement may include signal sampling. Given a signal a and a Boolean signal c representing a clock, the measurement may build an array b of values of a[i] where c[i]=1. Another example measurement includes measuring a mean value m of signal a using the expression:

$$\left(\sum_{i=0}^{N-1} a[i]\right)/N$$

Another example measurement includes performing a measurement of a root mean square (RMS) of signal a using the expression:

$$\sqrt{\frac{\sum_{i=0}^{N-1} a^2[i]}{N}}$$

Another example measurement includes measurement of a signal frequency using the expression:

$$f = \left(\frac{2\pi}{\Delta t}\right) \text{argmax} \left| F(m, \omega) \right|$$

where $F(m,\omega)$ stands for the discrete Short-time Fourier transform (STFT), and argmax returns the position index in the array where the function value is maximal. Another example measurement may include measuring a centered signal using expression a[i]−m, where m is the mean value of a. The discrete-time STFT may use a sliding window.

FIGS. 2A and 2B illustrate aspects of a discrete-time STFT according to an example of the disclosure. FIG. 2A shows a sliding window 202 that slides along a time axis 200. A signal 204 is also shown in FIG. 2A. This window 202 of a fixed size slides along the time axis 200, and for each position of the window, the discrete-time Fourier transform is applied to the part of the signal 204 covered by the window 202. This part of the signal is multiplied by a window function such as the rectangular or Hann function represented by the expression:

$$F(i, \omega) = \sum_{n=0}^{N-1} a[n]w[n-i]e^{-j\omega n}$$

where i is the position of the sliding window 202, a is a (sampled) signal, w is a window functions, N is the total number of samples, ω is the angular frequency, and F is the Fourier transform result. Usually the window function has a finite support (number of samples) W. In this case, the expression may be rewritten as:

$$F(i, \omega) = \sum_{n=0}^{W-1} a[i+n]w[n]e^{-j\omega n}$$

FIG. 2B shows an example spectrum of the signal 204 covered by the window 202 at a given position of the window 202.

In some aspects, signal and measurement representation may be in a discrete-time simulation. SystemVerilog-based (SV) notation may be used for the code and the pseudocode when describing measurement on-the-fly computation in simulation. Signals may be represented in SystemVerilog as variables or nets of the appropriate types. For example, analog signals may be of type real. A signal evaluation may be performed using a simulator. It is assumed that a fast simulation clock is used, for example, corresponding to the simulation time step, returned by the system function $global_clock.

A measurement may be computed using the following paradigm:
  always @$global_clock begin
  // measurement computation for a given tick
  . . .
  end Computations that may be performed at the end of the simulation may be placed in a final SV procedure. For example, the average of two signals may be measured using the SV notation:
  real ave;
  always @global_clock ave<=(a+b)/2;
Mean signal value may use the SV notation:
  real sum=0.0;
  real mean;
  int N=0;
  always @global_clock begin
  N<=N+1; sum<=sum+a;
  end
  final mean=sum/N;
Signal sampling may use the following SV notation:
  real b=0; // Initialized for the case when c is 0 at the beginning
  always @$global_clock if (c) b<=a;
or use the notation:
  real b=0;
  always @($global_clock iff c) b<=a;

The present disclosure describes techniques for transforming measurement computations over arrays carried out in MATLAB or Python to code (e.g., SystemVerilog RNM) to be executed as part of simulation. Simulation improvement techniques (e.g., dead code elimination) may be applied to the generated simulation code.

Not all computations available in post-processing mode may be rewritten into an equivalent on-the-fly form. For instance, centered signal value computation may involve knowing the mean value of the signal, which becomes available only at the end of the simulation.

Certain aspects provide techniques for rewriting certain function families designated as f1, f2 and D. For the sake of conciseness, these are described as normal functions, but f2 and f3 are not individual functions but families of functions of similar characteristics. A normal function is syntactical construct function in SystemVerilog. A SystemVerilog syntax is used to describe the implementation of the functions, even though the origin may be MATLAB or Python.

For instance, for signal sampling, function f1 performs signal sampling. The arrays are of type real for illustration. It could be any user or standard type and use notation:

```
function real[$] f1(real a[N], bit c[N]);
  array b[$];
  foreach (a[i])
    if (c[i]) b.push_back(a[i]);
  return b;
endfunction
```

For example, array a of size N may be provided, shown as a[N], and a bit array c of size N may be provided, shown as c[N]. For each of element of array a, if the corresponding element of array c is logic high, the values of array are included in array b, and array b may be used for computation.

The input to f1 may be two arrays of size N representing the simulation trace. Array a contains the trace values sampled at $global_clock granularity, while array c indicates sampling instants associated with a. c is called an origin of the returned array b. A dummy origin id[N] may be associated with arrays corresponding to the signal traces, where the dummy origin id[N] is a Boolean array with all elements set to 1. An example on-the fly implementation of this function includes:

```
real b=0.0;
always @($global_clock iff c) b<=a;
``` a and b for the on-the fly implementation may be signals of the same type as the arrays a and b in the post-processing mode. In other words, in SystemVerilog, resampling may be implemented using a global clock which has a cycle for every simulation step. At each cycle of the global clock, if the value of c is logic high, the corresponding value of array a is included in array b.

For a bounded computation, functions of the f2 family perform computations on arrays such that an element i of the resulting array depends only on elements i of the input arrays and on elements j<i and j>i within some finite bounds on the |j−i| span. Without loss of generality, it may be assumed that f2 has two input arguments a1 and a2; the same idea may be applied to any number of input arguments. An example f2 function includes:

```
function real[n] f2(real a1[n], a2[n]);
  real b[n];
  var v=v0;
  for (i=0; i<n; i++)
    b[i]=func(a1[i+lb1], . . . , a1[i+ub1], a2[i+lb2], . . . , a[i+ub2], v);
  return b;
endfunction
```

In other words, for two arrays a1[n] and a2[n], a computation may be performed to calculate array b[i] which depends on values of array a1 and a2 with some shift as indicated by the values of the lower bounds lb1, lb2 and of the upper bounds ub1, ub2. For example, for sample i and array a, the function for computing b may be based on sample i plus a lower bound lb1 till an upper bound ub1. The input arrays a1 and a2 are of the same sampling origin (according to the origin definition provided with the description of function f1) and hence of the same size n, and n may differ from the trace length N. In practice, the same function may output several arrays simultaneously, but assuming non-recursive functions, it is possible to automatically convert such functions to this form by splitting, instantiating and merging functions. The actual implementation performs a similar analysis without actually rewriting the functions.

Each entry of the output array b may depend on the current, previous and subsequent values of arrays a1 and a2 and on some auxiliary variable v. For all indices i, the referenced values of a1 are taken from the range [i+lb1, i+ub1], where lb1 is less than or equal to ub1 and are integer constants corresponding to a lower and an upper bound, respectively. lb1 and ub1 may be negative, zero, or positive, and the same may be true for a2. Variable v is initialized to some value at its declaration. There may be any number of variables of different types or there may be no variables at all, in some cases. Function "func" may not change the values of a1 and a2 but it may change the value of v. In a specific implementation of f2, the body of function func may be inlined, yet a similar analysis may be carried out.

For example, averaging of signals, time shift, stability check, rising edge of a clock, and signal frequency measurements may (and usually are) implemented as family f2 functions. For signal average, the following annotation may be used:

```
for (i=0; i<n; i++)
  b[i]=(a1[i]+a2[i])/2;
```

Here lb1=lb2=ub1=ub2=0 and there is no auxiliary variable v. In other words, array b[i] may be calculated as the sum of arrays a1[i] and a2[i] divided by two (e.g., since there are two arrays a1[i] and a2[i]). For time shift by m, the following algorithm may be used:

```
for (i=0; i<n; i++)
  b[i]=a1[i+m];
```

Here lb1=ub1=m which may be both positive and negative (e.g., m=0 corresponds to copying the original array) and there is no auxiliary variable. In other words, an element i of array b may be equal to the corresponding element in array a1 with a shift of m. To avoid accessing out of range values, boundary conditions are verified and there may be pre-defined default values for out-of-bound accesses.

For stability check, the following algorithm may be used:

```
int ctr=0;
for (i=0; i<n; i++)
  if (a1[i]==a1[i−1]) begin
    b[i]=1; ctr=ctr++;
  end
  else begin
    b[i]=(ctr<K); ctr=0;
  end
```

Here, b is a Boolean array in which zero entries correspond to stability violations; lb1=−1, ub1=0, the auxiliary variable is ctr. In other words, the stability check code generates array b indicating the stability of array a based on a comparison of each element of array a (e.g., a1[i] with a previous element of array a (e.g., a1[i−1]). For clock rising edge, the implementation may be include lb1=0, ub1=1, and no auxiliary variable. For signal frequency, a discrete Fourier transform (dft) may be used to determine a frequency associated with sampled values of a waveform. The following algorithm may be used:

```
complex v[W];
for (i=0; i<n; i++) begin
  v=dft(a1[i−w+1], a1[i−w+2], . . . , a1[i]);
  b=argmax(abs(v))*2*pi/delta_t;
end
```

Here, lb1=1−w, ub=0, v is a complex array of a constant size W containing the signal spectrum, abs( ) returns the magnitude of a complex number, pi stands for π, and delta_t is the time granularity. b is the output array, v is a spectrum array, argmax is the array position with the maximal function value. The window position is defined as i−w+1. The frequency is the bin index multiplied by 2*pi/delta_t.

Some aspects provide techniques for the determination of buffer sizes. For the on-the-fly implementation of bounded computations, buffers of an appropriate size may be introduced. A delay D is implemented to process future values. It may be computed as $D=\max_j(0, ub_j)$, where j ranges over the input arguments of f2. The minimum buffer size ($B_j$) for signal $a_j$ can thus be $B_j=D-lb_j$. In other words, the delay D may be calculated as the maximum of 0 and the upper bound of the samples used for the bounded computation. The minimum buffer size may then be calculated as the delay minus the lower bound of the samples used for the bounded computation. For example, the buffer size may correspond to the difference between the upper bound and the lower bound of the samples used for the bounded computation.

The following SystemVerilog code shows an on-the-fly implementation of function f2 (e.g., for a bounded computation) for two input arguments using buffers indicated as buf1[B1] and buf2[B2]. It is also assumed that the signal type is real.

real buf1[B1], buf2[B2];
real v;
always @($global_clock iff c) begin
 b=func(buf1[D−1−lb1], . . . , buf1[D−1−ub1], buf2[D−1−lb2], . . . , buf2[D−1−ub2], v);
 shift(buf1);
 shift(buf2);
end The buffers buf1 and buf2 are allocated for signals a1 and a2, respectively. If the size of a buffer is 0, the buffer may be eliminated. The variable(s) v have a static lifetime (e.g., once this variable is declared, it exists till the program executes). Some buffer indices in function func may equal to −1. bufj[−1] may be interpreted as a shortcut for taking the current value aj, j=1, 2. Function "shift" shifts the values in bufj as follows: bufj[0:Bj−2]=bufj[1:Bj−1]; bufj[Bj−1]=aj. Boolean signal c is the origin of arrays a1 and a2. For example, let function f2 be defined as:

```
function real [n] f2 (real a1[n], a2 [n]);
  real b[n];
  real v = 1;
  for (i = 0; i < n; i ++) begin
    b[i] = ($sin(a1[i+7]) + $sin(a1[i+6]) +
           $sin(a1[i+5])) * ($cos(a2[i+1]) − $cos(a2[i−1])) * v;
    v += 0.01;
  end
  return b;
endfunction
```

In this case ub1=7, lb1=5, ub2=1, lb2=−1, D=max(0, ub1, ub2)=7, B1=D−lb1=2, B2=D−lb2=8. In other words, b[i] is computed as sine of a future value of a1 (e.g., value of a1 after 7 sampling clock ticks) plus sine of a future value of a1 in 6 sampling clock ticks, etc. The on-the-fly implementation thus becomes:

real buf1[2], buf2[8];
real v=1.0;
always @($global_clock iff c) begin
 b=(sin(a1)+sin(buf1[0])+sin(buf1[1]))*(cos(buf2[5])−cos(buf2[7]))*v;
 v=v+0.01;
 shift(buf1);
 shift(buf2);
end Note that buf1[−1] was replaced with a1, in this example. Some aspects provide techniques for buffer compaction. In some cases, the buffer size for bounded computations may be reduced by grouping several signals together. Namely, when func has a form func(a1, . . . , aj, f(a_j1, . . . , a_jk)), where f is some function, then it is possible to introduce an intermediate signal x=f(a_j1, . . . , a_jk) and allocate buffers separately for a1, . . . , aj, x, a_j1, . . . , aj_k. Consider the following expression:

$$b[i]=a1[i+8]+a1[i+5]+a2[i-5]+a2[i-7]+a3[i-6]+a3[i-7]$$

The right hand side has a form of func(a1, f(a2, a3)). The original version may include buffer allocation of the total size of 3+15+15=33. If an intermediate signal x is introduced as follows:

$$x[i]=a2[i]+a2[i-2]+a3[i-1]+a3[i-2]$$

then the original assignment becomes:

$$b[i]=a1[i+8]+a1[i+5]+x[i-5]$$

For computation of x, the delay (D) may be equal to 0. Thus, to compute x from a2 and a3, two buffers of size 2 may be used (e.g., one buffer for a2 of size 2 (D minus lower bound of 2), and another buffer for a3 of size 2 (D minus lower bound of 2).

For computation of b, delay (D) may be equal to 8. Thus, the computation of b uses two buffers of size 3 and 13 (e.g., one buffer for a1 of size 3 (D minus lower bound of 5) and another buffer for x of size 13 (D minus lower bound of −5). Hence, the total buffer size is 2+2+3+13=20 when the intermediate signal x is introduced. Therefore, the buffer size may be reduced from 33 to 20 in this manner.

Functions of f3 family compute a scalar value from an array. They are a scalar counterpart of f2:

function real f3(real a[n])
 real r=r0;
 real v=v0;
 real m;
 for (i=0; I<n; i++)
  r=acc(r, v, a [i+lb], . . . , a[i+ub]);
 m=f(r, v);
 return m;
endfunction The intermediate result r is computed by applying function "acc" to the previously computed value of r based on several values of the input array a. Function acc may also depend on some variable(s) v which modifies, but it should not change values in a. The final result m is computed by applying some function f to the intermediate result r and variable(s) v. In the actual implementations, functions acc and/or f may be inlined. The notation is similar to the one used for f2, hence splitting and merging of functions applies here in a similar way. In other words, a value m may be calculated using the array a[n] based on past and future samples associated with the waveform.

Essentially, the accumulation is considered as a variant of the map/reduce computation paradigm. The on-the fly implementation implements an allocation of a buffer of size B=max(0, ub)−lb. When B=0, no actual buffer is used.

The following SystemVerilog code shows the on-the-fly implementation of f3.

real buf[B];
real v;
real r;
real m;
always @($global_clock iff c) begin b=acc(r, v, buf[D−1−lb], . . . , buf[D−1−ub]);
shift(buf1);
end
final m=f(r, v);

Computing mean value measurement and RMS under this category is implemented with no buffer. For example, computing the mean value is achieved using the following algorithm:

real v=0;
real r=0;
real m;
for (i=0; i<n; i++) begin
    r=r+a[i]; v=v+1;
end
m=r/V;

Here, lb=ub=0, hence no is used. In other words, the mean value m may be calculated using value r (e.g., a sum of samples in array a[i]) divided by v (e.g., the total number of samples)).

A class of computations in AMS design verification is checking the correctness of measurements. Checking may be considered as a Boolean measurement producing a 0 output whenever the check fails. In digital design verification, such checks are called assertions. Assertion statements are part of the SystemVerilog language known as SystemVerilog Assertions (SVA). Digital simulators natively and efficiently support SVA. Certain aspects are directed to reducing measurement checks to assertion evaluation. SVA assertions may be either temporal (concurrent) or non-temporal (immediate).

For a scalar measurement check, reduction of scalar measurement checking to assertions may use the accumulation function:

function bit f3(real a[n]);
    real r=r0;
    real v=v0;
    bit m;
    for (i=0; i<n; i++)
        r=acc(r, v, a[i+lb], . . . , a[i+ub]);
    m=f(r, v);
    return m;
endfunction f and the measurement check m are Boolean. In the on-the-fly implementation, the Boolean result computation is replaced by an immediate assertion placed in a final procedure:

real buf[B];
real v=v0;
real r=r0;
always @($global_clock iff c) begin
    r=acc(r, v, buf[D−1−lb], . . . , buf[D−1−ub]);
    shift(buf1);
end
final assert (f(r, v));

Some aspects provide a memoryless bounded local computation. When a bounded computation f2 is memoryless (e.g., when there is no dependency on the previous or subsequent entries of an array), checking the result in the on-the-fly implementation can be replaced with an immediate assertion. For the original function:

function bit[n] f2(real a1[n], a2[n]);
    bit b[n];
    real v=v0;
    for (i=0; i<n; i++)
        b[i]=func(a1[i], a2[i], v);
    return b;
endfunction the on-the-fly equivalent becomes:

real v;
always @($global_clock iff c) begin
    assert (func(a1, a2, v));
end

When signals a1 and a2 are sampled at the finest granularity, then it may suffice to use a single deferred immediate assertion such as:

assert #0(func(a1, a2, v));

As an example, a signal comparison is expressed as:

assert #0 (a<b);

If variable(s) v in f2 explicitly depends on iteration i, this dependency is replaced by a dependency on the current time (i$\Delta$t), where $\Delta$t is the time step granularity. This current simulation time (i$\Delta$t) is returned by the SystemVerilog system function $realtime. As an illustration, a signal waveform may be checked using a deferred immediate assertion:

assert #0 ($abs(a−A*$ sin(omega*$realtime))<eps);

In the general form, a bounded computation that implements non-trivial buffers realizes a finite automaton, and as such it is implemented as a concurrent assertion. For practical purposes, an assertion library may be created for common measurement checks.

As an example, consider the signal stability check described herein. In SVA, it is implemented as:

property stability_check(a, duration);
    realtime t;
    @a (1, t=$realtime)|=>$realtime>=t+duration);
endproperty The property may be instantiated in an assertion. Argument "duration" corresponds to K$\Delta$t. The property verifies that the time interval between two consecutive changes of signal a are at least "duration" time units apart.

The techniques described herein implement access to previous and subsequent elements of arrays within some constant bounds. If this assumption is violated or when it cannot be validated using static analysis techniques, no formally equivalent rewriting of the computation to an on-the-fly form may be possible in some implementations.

Consequently, the on-the-fly computation of a centered signal value may be formally infeasible because theoretically the mean signal value can only be computed at the end of simulation. Some aspects of the present disclosure are directed to techniques for precomputing such values. For example, this is the case when the computation is represented in the form f2 with one or more additional scalar arguments s which depend on the entire array and cannot be computed on-the-fly. For example, for algorithm:

function real [n] f2(real a1[n], a2[n], real s);
    real b[n];
    real v=v0;
    for (i=0; i<n; i++)
        b[i]=func(a1[i+lb1], . . . , a1[i+ub1], a2[i+lb2], . . . , a[i+ub2], v, s);
    return b;
endfunction In practice, the value of s changes little with increasing signal trace length, consequently it is possible to precompute its value on a limited fragment of the trace and use it on the remainder of the trace. Namely, the total trace of size N may be divided into two subtraces of sizes $N_1$ and $N_2$, where $N_1$ is constant, and large enough to accurately precompute the value of s.

FIG. 3 illustrates various example techniques for precomputing a value, in accordance with certain aspects of the present disclosure. For example, as shown by timing diagram 300, the first time interval $N_1$ may be used only for computing s (e.g., a mean value of waveform segment), while the computation of value b is done on interval $N_2$. The value of s may be held constant across time interval $N_2$. As shown by timing diagram 302, first, the value of s may be computed on time interval $N_1$, and then the value of b may be computed on the entire interval N. The value of s may be held constant across time interval $N_2$.

As shown by timing diagram 304, the first time interval $N_1$ may be used only for computing s, while the computation of b is done on interval $N_2$. The value of s may be updated at each point of time interval $N_2$ as explained for functions of the f3 family. As shown by timing diagram 306, first, the value of s may be computed on time interval $N_1$, and then the value of b may be computed on the entire interval N. The value of s may be updated at each point of time interval $N_2$ (e.g., updated using samples associated with time interval $N_2$).

The techniques described with respect to timing diagrams 304 and 306 are computationally intensive but produce more accurate results as the values of s become more accurate with increasing number of samples. However, they may not be appropriate in all cases. For example, if a centered value evaluation is used for measuring signal period, methods described with respect to timing diagrams 304 and 306 cannot be used because the base level would not be constant, as shown in FIG. 4.

Figure 4:
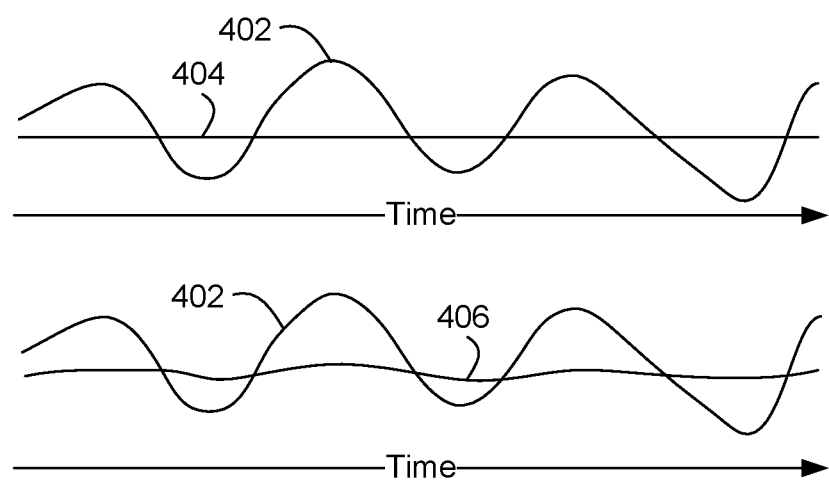
FIG. 4 shows an example signal and centered values to illustrate aspects of precomputing according to an example of the present disclosure.

FIG. 4 shows an example signal 402 and centered values 404, 406. Centered value 404 illustrates a value calculated after an entirety of the signal 402 is obtained, such that the centered value 404 is constant. Centered value 406 is updated on-the-fly based on the signal 402, and hence, the centered value 406 can vary as it is updated on-the-fly. The variation of the centered value 406 can lead to errors in measuring the signal period of the signal 402, for example.

It is noted that the techniques described with respect to FIG. 3 for computing s on time interval $N_1$ may be performed in a post-processing mode and not in the on-the-fly mode, in some cases. For techniques described with respect to timing diagrams 302 and 306, there may be subtleties due to boundary conditions which are addressed herein.

Some aspects of the present disclosure are directed to a cosimulation technique for performing on-the-fly computation by allocating buffers. Cosimulation generally refers to a technique for performing computation during (e.g., in parallel with) simulation or emulation. Computations using cosimulation may be performed in the post-processing mode (e.g., using MATLAB), and not in the simulation mode. Still, cosimulation is a kind of on-the-fly computation because all the buffers used for computations may be of constant size.

Since AMS signal behavior is usually ergodic, it is possible to compute the measurements piecewise, by capturing signal values in sufficiently large buffers of constant size. The problem arises at buffer boundaries if there is a reference to signal values before the start of a buffer and after the buffer end. For this purpose, multiple (e.g., three) adjacent buffers may be maintained, referred to herein as a past buffer, current (middle) buffer, and a future buffer.

Figure 5:
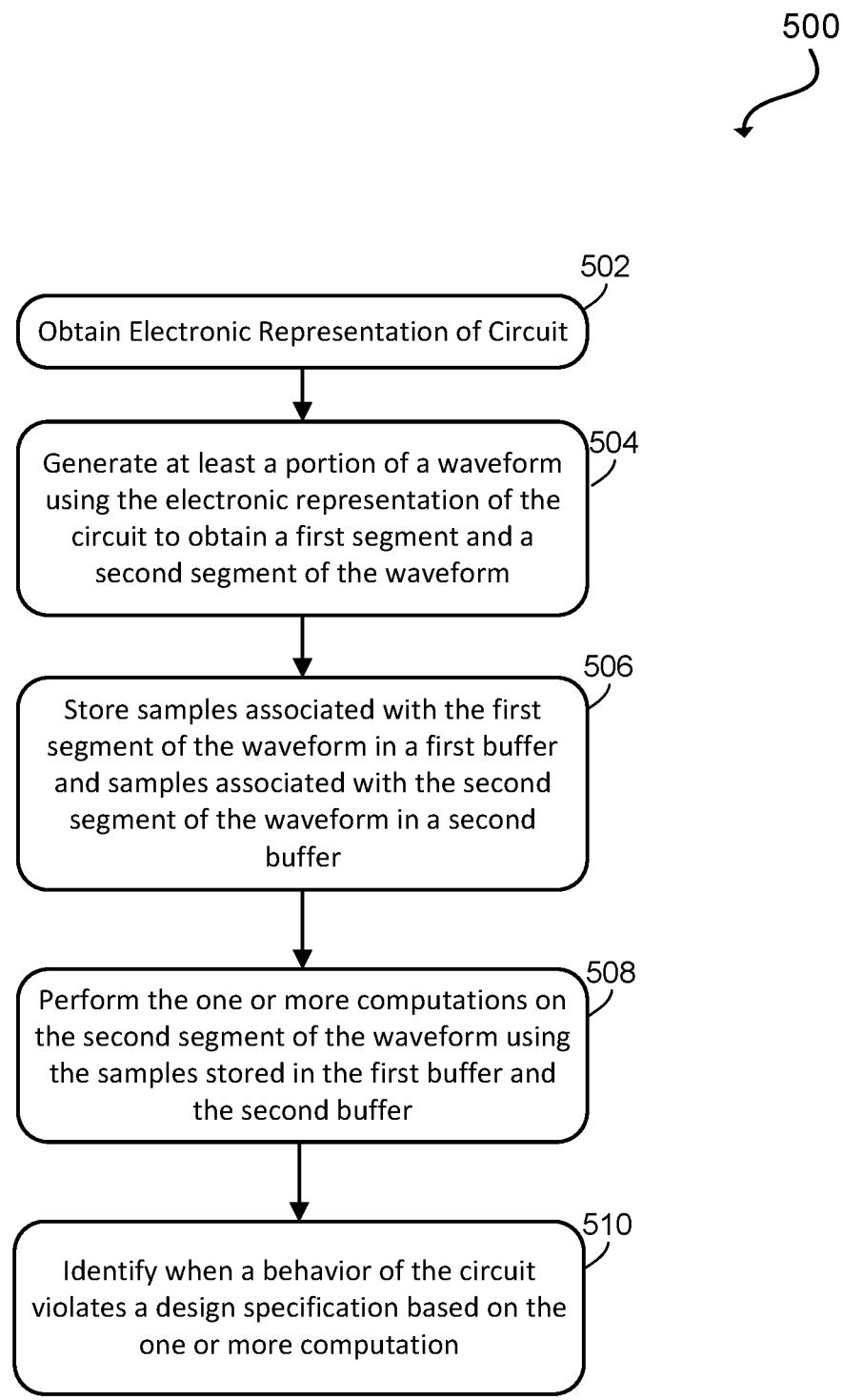
FIG. 5 is a flowchart of a method for on-the-fly AMS design verification using cosimulation, according to an example of the disclosure.

FIG. 5 is a flow diagram illustrating example operations 500 for circuit design verification, in accordance with certain aspects of the present disclosure. As described in further detail below, the operations 500 can be embodied by one or more sets of instructions, which may be one or more software modules, stored on a non-transitory computer-readable medium. One or more processors of a computer system can be configured to read and execute the one or more sets of instructions, which causes the one or more processors to perform the various operations of the operations 500. Further details are provided below. In some examples, some operations or steps of the operations 500 may be embodied as one or more sets of instructions as one or more software components, and other operations or steps of the operations 500 can be embodied as one or more other sets of instructions as one or more other software modules. The different software components can be distributed and stored on different non-transitory computer-readable media on different computer systems for execution by respective one or more processors of the different computer systems in some examples.

The operations 500 begin, at 502, with the one or more processors obtaining an electronic representation of a circuit. At 504, the one or more processors may generate at least a portion of a waveform using the electronic representation of the circuit to obtain a first segment and a second segment of the waveform associated with the circuit. The portion of the waveform may be generated using simulation or emulation. At 506, the one or more processors store samples associated with the first segment of the waveform in a first buffer and samples associated with the second segment of the waveform in a second buffer.

At 508, the one or more processors perform the one or more computations on the second segment of the waveform using the samples stored in at least the first buffer and the second buffer. In some aspects, the first segment may be prior to the second segment of the waveform.

Samples associated with a third segment of the waveform may be stored in a third buffer, the third segment being after the first segment of the waveform. The first segment may be referred to herein as a prior segment (or prior values or sampled values), the second segment may be referred to as a current segment (or current value or sampled values), and the third segment may be referred to as a future segment (or future value or sampled values).

The one or more computations may be performed using the first buffer, the second buffer, and the third buffer. In some aspects, the one or more processors may calculate a value using samples stored in the first buffer, the second buffer, and the third buffer. The one or more computations on the second segment of the waveform may be based on the calculated value. At 510, the one or more processors identify when a behavior of the circuit violates a design specification based on the one or more computation. The various buffers used for computation is described in more detail with respect to FIG. 6.

Figure 6:
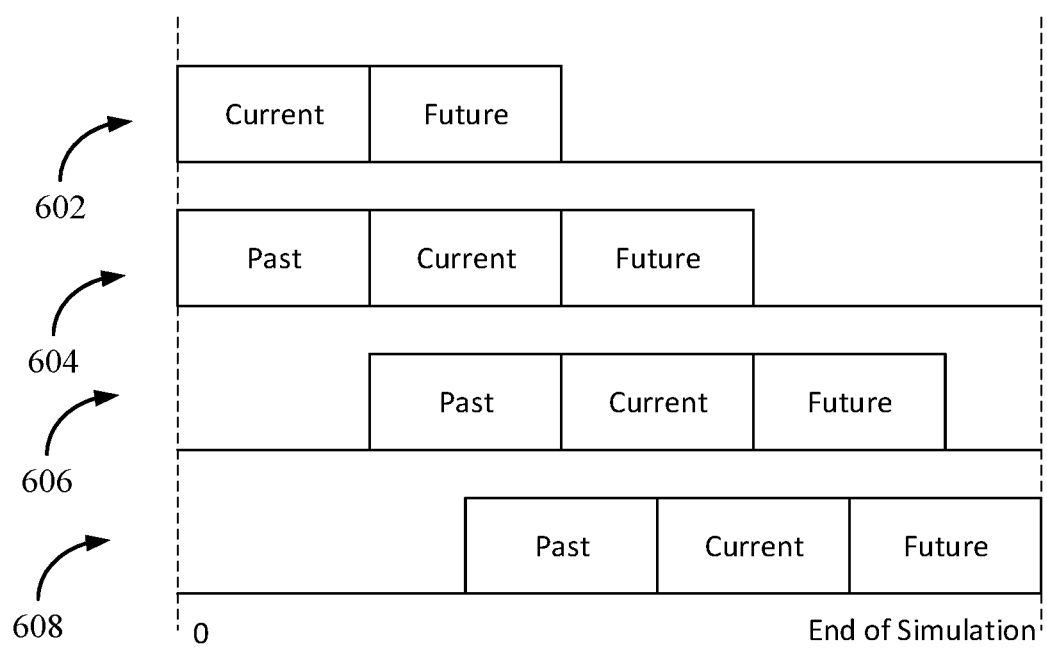
FIG. 6 illustrates aspects of buffers in a cosimulation mode according to an example of the present disclosure.

FIG. 6 illustrates buffers associated with past, current, and future values for computation, in accordance with certain aspects of the present disclosure. Initially, the past buffer may not be used (e.g., may be set to 0s). Each of rows 602, 604, 606, 608 show storage of samples of a simulated waveform in buffers (e.g., past, current, and future buffers). For example, the samples of the waveform associated with row 602 may be stored in a current buffer and a future buffer (e.g., the past buffer may not be used or set to 0s, as described). For row 604, the samples previously stored (e.g., for row 602) in the current buffer are now stored in a past buffer, the samples previously stored (e.g., for row 602) in the future buffer are now stored in the current buffer, and further samples may be stored in a future buffer, and so on for other rows until the end of the simulation, as shown.

Computations may be performed in the total space of the three buffers for each row, while the results are accounted for in the current buffer. If for some signals or computation, the maximum look ahead and the past memory depth are known to be bounded as described herein, the sizes of the past and future buffers are set by these bounds.

As shown, the end of the future buffer is aligned with the end of the simulation. Aligning the end of the last position of the future buffer with the end of simulation makes the computations in the current buffer valid. As one example, centered value computation is in accordance with expression:

$$b=a-\text{mean}(a).$$

The value of m=mean(a) is calculated from the data in all three buffers: past, current and future; then b=a−m is computed in the current buffer. For time shift backward, the expression may be:

$$b[i]=x[i-m], b>0.$$

These values are computed starting from sample m from the beginning of the past buffer. The result for the values in the current buffer is correct when m does not exceed the size of the past buffer.

For time shift forward, the expression: b[i]=x[i+m], m≥0 is used. These values are computed until m samples before the end of the future buffer. The result for the values in the current buffer is correct when m does not exceed the size of the future buffer.

Stability check is computed correctly in the current buffer when the minimum stability interval K is less than the size of the future buffer. These examples show that when the size of the buffers is large enough, the computation results are accurate for bounded computations of original (non-sampled) signals and may otherwise be sufficiently approximated due to ergodicity of signal behavior.

The techniques described herein show how measurement computations specified for the post-processing mode can be performed on-the-fly. When bounded memory is used, it is possible to automatically convert the post-processing computation into an on-the-fly form that can be evaluated in a simulation. In particular, it is possible to convert Boolean checks into assertions, temporal or non-temporal. The evaluation results in both post-processing and on-the-fly modes may be the same. This transformation is suitable for emulation and for RNM simulation.

When a post-processing computation involves unbounded memory or multiple passes, then an on-the fly computation is still possible, but the results may differ. The suggested techniques include cosimulation when the on-the-fly computation is performed in the post-processing mode but using bounded buffers, and precomputing relevant scalar values which combines a one-time precomputation on a bounded buffer with a simulation mode on-the-fly computation for the rest of the trace. The latter method is still applicable for emulation and RNM simulation, the former working well in parallel with a heavy weight analog simulation.

The present disclosure has described measurements are computed natively in simulation (or emulation). The present system is used to implement an upper bound on the size of memory used to store signal history, reducing memory usage. The present disclosure also described measurement checks that are written in the form of Boolean or temporal assertions. The techniques described herein may be extended to cases in which computations depend on one or more values. The evaluation of a circuit representation is implemented using unbounded memory or multiple passes over a waveform trace. Moreover, the present disclosure explains a co-simulation method that uses a post-processing mode for handling a common case of on-the-fly measurement computation. Features of various examples and benefits that may be achieved include: computation and checking of AMS measurements on-the-fly in simulation or in emulation; early detection of incorrect design behavior in AMS simulation or emulation; fast computation and checking of measurements over long waveforms; reusing the same measurement specifications in post-processing and in on-the-fly modes; automatic rewriting of measurement functions into the form suitable for online evaluation in simulation or emulation; precomputation of values over a subset of variables to simplify rewriting and reduce memory requirements of measurement functions; on-the fly computation in cosimulation mode in which measurement evaluation is done in post-processing mode but using smaller fixed-size buffers; and reduction of checks of measurements to checking SystemVerilog Assertions (SVA).

Figure 7:
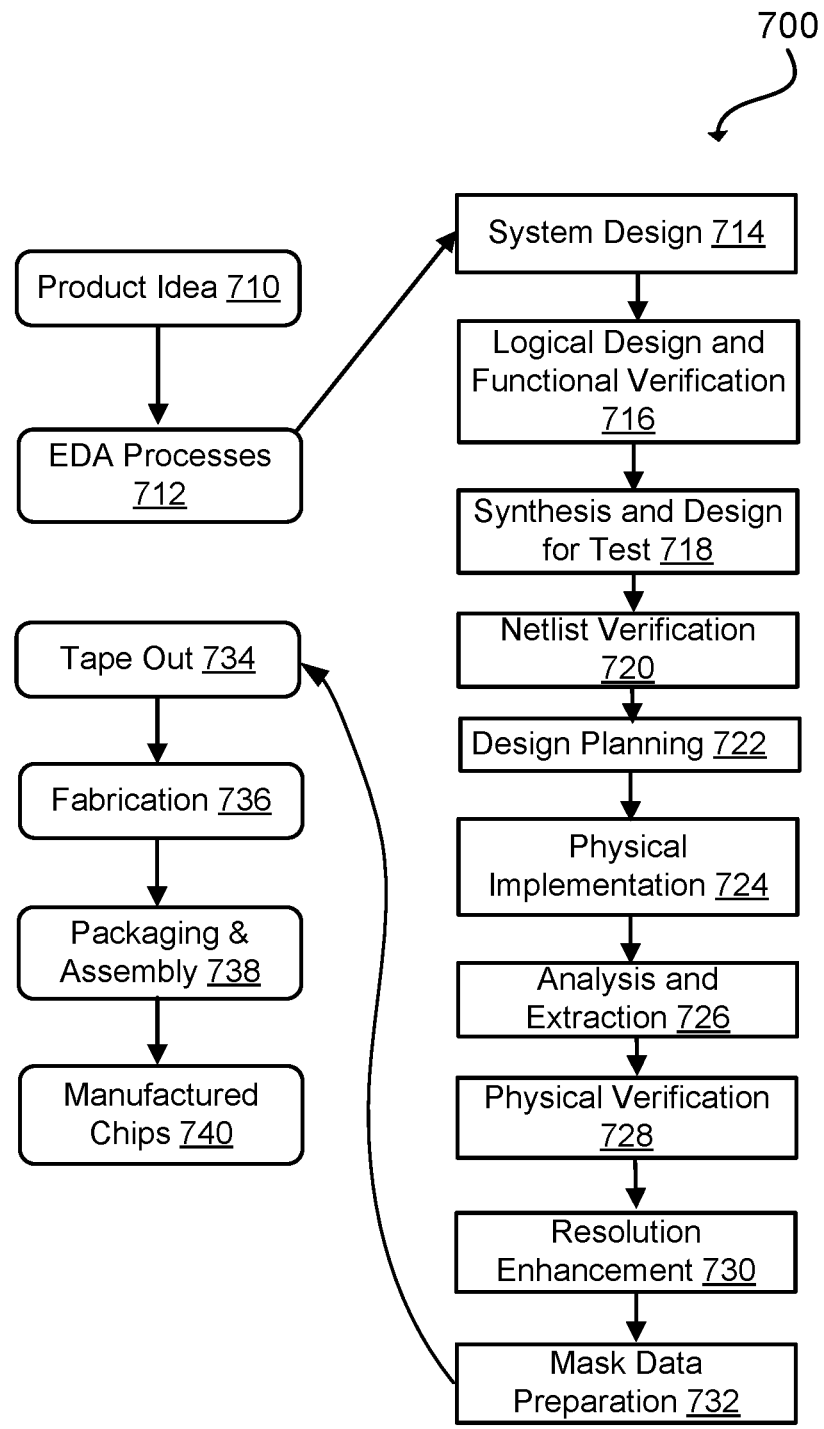
FIG. 7 depicts a flowchart of various processes used during the design and manufacture of an integrated circuit in accordance with some examples of the present disclosure.

FIG. 7 illustrates an example set of processes 700 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 710, with the creation of a product idea with information supplied by a designer, information that is transformed to create an integrated circuit that uses a set of EDA processes, at block 712. When the design is finalized, the design is taped-out, at block 734, which is when artwork (e.g., geometric patterns) for the integrated circuit is sent to a fabrication facility to manufacture the mask set, which is then used to manufacture the integrated circuit. After tape-out, at block 736, the integrated circuit is fabricated on a semiconductor die, and at block 738, packaging and assembly processes are performed to produce, at block 740, the finished integrated circuit (oftentimes, also referred to as "chip" or "integrated circuit chip").

Specifications for a circuit or electronic structure may range from low-level transistor material layouts to high-level description languages. A high-level of representation may be used to design circuits and systems, using a hardware description language (HDL) such as VHDL, Verilog, SystemVerilog, SystemC, MyHDL or OpenVera. The HDL description can be transformed to a logic-level register transfer level (RTL) description, a gate-level description, a layout-level description, or a mask-level description. Each lower representation level that is a more detailed description adds more useful detail into the design description, such as, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described may be enabled by EDA products (or tools).

During system design, at block 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 718, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 720, the netlist is checked for compliance with timing constraints and for correspondence with the HDL code. The above methodologies and/operations of FIG. 1, and various examples described above, can be implemented in whole or in part in any of blocks 716, 718, and 720.

During design planning, at block 722, an overall floor plan for the integrated circuit is constructed and analyzed for timing and top-level routing. During layout or physical implementation, at block 724, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 726, the circuit function is verified at the layout level, which permits refinement of the layout design. During physical verification, at block 728, the layout design is checked to ensure that manufacturing constraints are correct, such as design rule check (DRC) constraints, electrical constraints, lithographic constraints, and that circuitry function matches the HDL design specification. During resolution enhancement, at block 730, the geometry of the layout is transformed to improve how the circuit design is manufactured.

During tape-out, data is created to be used (after lithographic enhancements are applied if appropriate) for production of lithography masks. During mask data preparation, at block 732, the tape-out data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Figure 8:
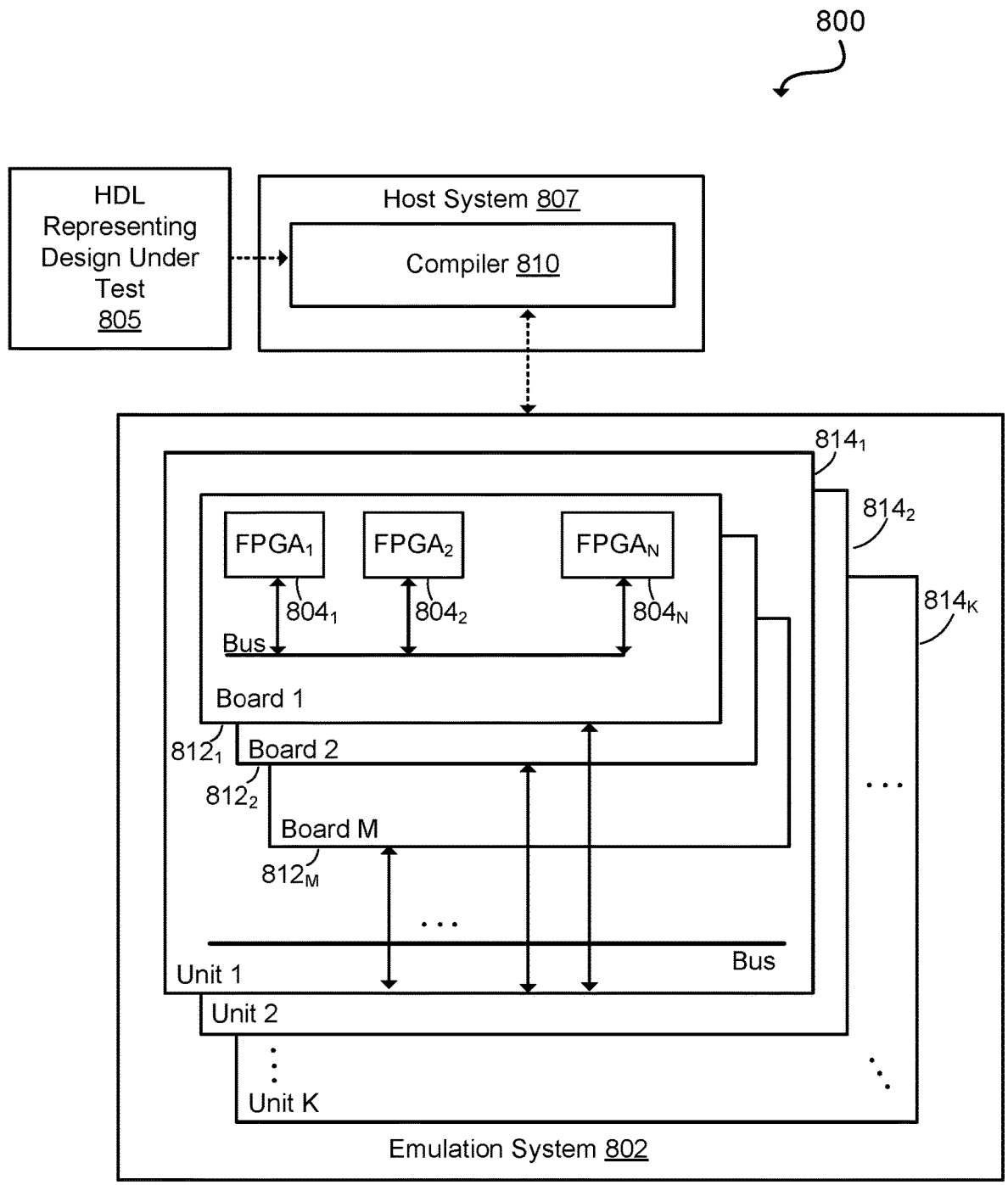
FIG. 8 depicts a diagram of an example emulation system in accordance with some examples of the present disclosure.

FIG. 8 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the example where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs $804_1$ and $804_2$ as well as additional FPGAs to $804_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, examples of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some examples, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802. The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some examples, one or more FPGAs of the emulators may have the trace and injection logic built into the silicon of the FPGA. In such an example, the FPGAs may not be structured by the host system to emulate trace and injection logic.

The host system 807 receives a description of a DUT that is to be emulated. In some examples, the DUT description is in a description language (e.g., a register transfer language (RTL)). In some examples, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some examples, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some examples, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 9:
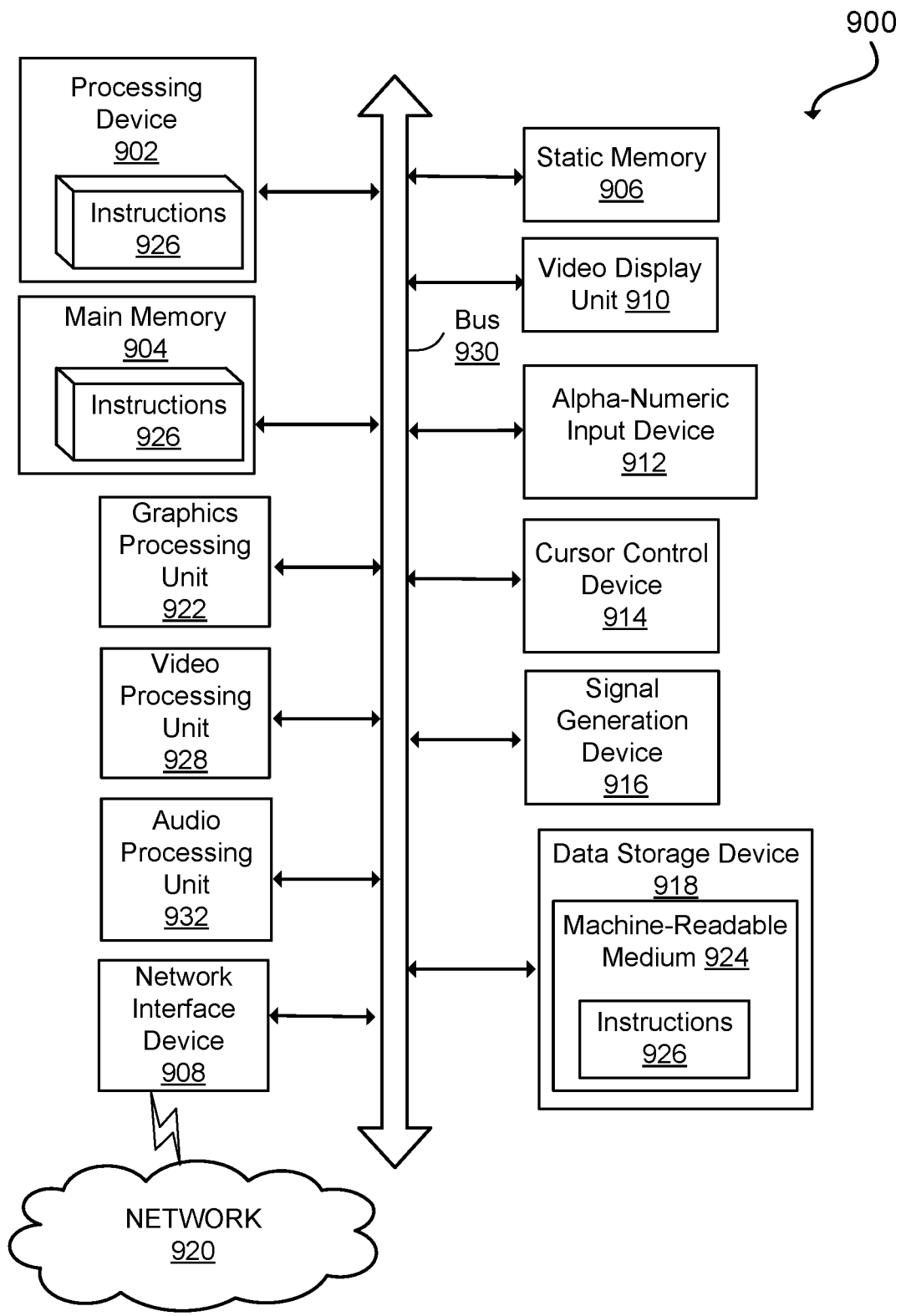
FIG. 9 depicts a diagram of an example computer system in which examples of the present disclosure may operate.

FIG. 9 illustrates an example of a computer system 900 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930. The main memory 904 includes or is a non-transitory computer readable medium. The main memory 904 (e.g., a non-transitory computer readable medium) can store one or more sets of instructions 926, that when executed by the processing device 902, cause the processing device 902 to perform some or all of the operations, steps, methods, and processes described herein.

Processing device 902 represents one or more processors such as a microprocessor, a central processing unit, or the like. More particularly, the processing device 902 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing some or all of the operations, steps, methods, and processes described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (e.g., a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also including machine-readable storage media.

In some implementations, the instructions 926 include instructions to implement functionality described above. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 902 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader scope of implementations of the disclosure as set forth in the following claims. In addition, an illustrated example implementation need not have all the aspects or advantages shown. An aspect or an advantage described in conjunction with a particular example implementation is not necessarily limited to that example implementation and can be practiced in any other example implementations even if not so illustrated or if not so explicitly described. Where the disclosure refers to some elements in the singular tense, more than one element can be depicted in the figures and like elements are labeled with like numerals. The disclosure and drawings are, accordingly, to be regarded in an illustrative sense rather than a restrictive sense. Further, methods described herein may be described in a particular order of operations, but other methods according to other examples may be implemented in various other orders (e.g., including different serial or parallel performance of various operations) with more or fewer operations.

What is claimed is:

1. A method for circuit design verification, comprising:
obtaining an electronic representation of a circuit design;
generating at least a portion of a waveform using the electronic representation of the circuit design to obtain a first segment of the waveform associated with the circuit design;
converting, via one or more processors, one or more measurement functions to code for performing one or more computations on the first segment of the waveform;
performing the one or more computations on the first segment of the waveform using the code, wherein the one or more computations include a bounded computation on samples within an upper bound of the first segment and a lower bound of the first segment, the samples being stored in a buffer; and
identifying when a behavior of the circuit design violates a design specification based on whether a result of the one or more computations meets a threshold.

2. The method of claim 1, wherein generating at least the portion of the waveform comprises simulating or emulating the circuit design using the electronic representation.

3. The method of claim 1, wherein the one or more computations are performed during the generation of at least the portion of the waveform.

4. The method of claim 1, wherein converting the one or more measurement functions to the code for performing the one or more computations comprises converting the one or more measurement functions to a SystemVerilog Real Number Model (RNM).

5. The method of claim 1, further comprising calculating a value on a second segment of the waveform, wherein the one or more computations on the first segment of the waveform is based on the calculated value.

6. The method of claim 5, wherein the second segment of the waveform is prior to the first segment of the waveform.

7. The method of claim 5, wherein the one or more computations is performed on both of the first segment and the second segment of the waveform.

8. The method of claim 5, wherein the calculated value is updated using samples obtained from the first segment of the waveform.

9. The method of claim 1, wherein:
the method further comprises determining a size of the buffer based on a difference between the upper bound and the lower bound.

10. The method of claim 1, further comprising converting digital design verification code to an assertion used to identify when the behavior of the circuit design violates the design specification during the generation of at least the portion of the waveform.

11. The method of claim 10, wherein the assertion comprises a SystemVerilog Assertions (SVA).

12. The method of claim 1, wherein identification of when the behavior of the circuit design violates the design specification occurs before conclusion of the generation of the at least the portion of waveform.

13. The method of claim 1, further comprising terminating the generation of at least the portion of the waveform when the behavior is identified violating the design specification.

14. The method of claim 1, wherein the first segment of the waveform is a portion that is less than an entirety of the waveform.

15. A method for circuit design verification, comprising:
obtaining an electronic representation of a circuit design;
generating at least a portion of a waveform using the electronic representation to obtain a first segment and a second segment of the waveform associated with the circuit design;
storing samples associated with the first segment of the waveform in a first buffer and samples associated with the second segment of the waveform in a second buffer;
performing, via one or more processors, one or more computations on the second segment of the waveform using the samples stored in the first buffer and the second buffer; and
identifying when a behavior of the circuit design violates a design specification based on whether a result of the one or more computations meets a threshold.

16. The method of claim 15, wherein the first segment is prior to the second segment of the waveform.

17. The method of claim 16, wherein:
samples associated with a third segment of the waveform are stored in a third buffer, the third segment being after the second segment of the waveform; and
the one or more computations are performed using the first buffer, the second buffer, and the third buffer.

18. The method of claim 17, wherein an end of the third segment of the waveform comprises an end of an entirety of the waveform obtained after the generation at least the portion of the waveform.

19. The method of claim 17, further comprising calculating a value using samples stored in the first buffer, the second buffer, and the third buffer, wherein the one or more computations on the second segment of the waveform is based on the calculated value.

20. An apparatus for circuit design verification comprising:
a memory; and one or more processors coupled the memory, the memory and the one or more processors being configured to:

obtain an electronic representation of a circuit design;

generate at least a portion of a waveform using the electronic representation of the circuit design to obtain a first segment of the waveform associated with the circuit design;

convert, via the one or more processors, one or more measurement functions to code for performing one or more computations on the first segment of the waveform;

perform the one or more computations on the first segment of the waveform using the code, wherein the one or more computations include a bounded computation on samples within an upper bound of the first segment and a lower bound of the first segment, the samples being stored in a buffer; and identify when a behavior of the circuit design violates a design specification based on whether a result of the one or more computations meets a threshold.

* * * * *